United States Patent [19]

Smolley

[11] Patent Number: 5,007,841

[45] Date of Patent: * Apr. 16, 1991

[54] INTEGRATED-CIRCUIT CHIP INTERCONNECTION SYSTEM

[75] Inventor: Robert Smolley, Porteuguese Bend, Calif.

[73] Assignee: TRW Inc., Redondo Beach, Calif.

[*] Notice: The portion of the term of this patent subsequent to Apr. 8, 2003 has been disclaimed.

[21] Appl. No.: 835,818

[22] Filed: Mar. 3, 1986

Related U.S. Application Data

[63] Continuation-in-part of Ser. No. 499,137, May 31, 1983, abandoned, and a continuation-in-part of Ser. No. 499,136, May 31, 1983, Pat. No. 4,574,331, and a continuation-in-part of Ser. No. 737,631, May 24, 1985, Pat. No. 4,581,679.

[51] Int. Cl.$^5$ ............................................. H05K 1/14
[52] U.S. Cl. ....................................... 439/66; 439/74
[58] Field of Search .......... 339/17 CF, 17 M, 17 LM, 339/17 N, 61 M, 59 M, DIG. 3; 361/393–401; 439/65, 66, 74, 91, 71

[56] References Cited

U.S. PATENT DOCUMENTS

| | | | |
|---|---|---|---|
| 3,327,278 | 6/1967 | Godel | 339/18 |
| 3,509,270 | 4/1970 | Dube et al. | 361/412 |
| 3,515,949 | 6/1970 | Michaels et al. | 361/394 |
| 3,616,532 | 11/1971 | Beck | 361/414 |
| 3,680,037 | 7/1972 | Nellis et al. | 339/61 M |
| 3,885,173 | 5/1975 | Lee | 361/403 |
| 3,904,934 | 9/1975 | Martin | 339/17 M |
| 4,037,270 | 7/1977 | Ahmann et al. | 339/17 CF |
| 4,164,003 | 8/1979 | Cutchaw | 361/403 |
| 4,249,302 | 2/1981 | Crepeau | 29/830 |
| 4,420,767 | 12/1983 | Hodge et al. | 439/78 |
| 4,502,098 | 2/1985 | Brown et al. | 361/383 |
| 4,574,331 | 3/1986 | Smolley | 361/393 |
| 4,581,679 | 4/1986 | Smolley | 339/17 M |

OTHER PUBLICATIONS

Technical Wire Products, Inc.; Tecknit; Data Sheet CEC-011, 7-1974.
IBM Bulletin, Beverly, vol. 8, No. 10, p. 1325, 3-1966.
IBM Bulletin, Agusta, vol. 10, No. 7, p. 890, 12-1967.

*Primary Examiner*—Neil Abrams
*Attorney, Agent, or Firm*—James M. Steinberger; Ronald L. Taylor

[57] ABSTRACT

An integrated-circuit (IC) chip packaging construction for mounting and interconnecting IC chips and IC chip packages with a multilayer printed circuit board, without soldering, special tooling or special labor, and for interconnecting IC chips with minimized interconnection lead lengths between the IC chips, without cable harnesses or back-panel wiring. The IC chips and IC chip packages are mounted and interconnected using an insulating board having openings through it, and a number of connector elements in the form of compressible wads of conductive wire. The connector elements are disposed in selected openings in the insulating board and compressed into contact with the contact areas on the IC chips and IC chip packages. In a three-dimensional construction employing the principles of the invention, the IC chips are arranged in modules, and interconnections may be made between IC chips within each module, transversely between modules, and in a third direction between layers of modules.

55 Claims, 3 Drawing Sheets

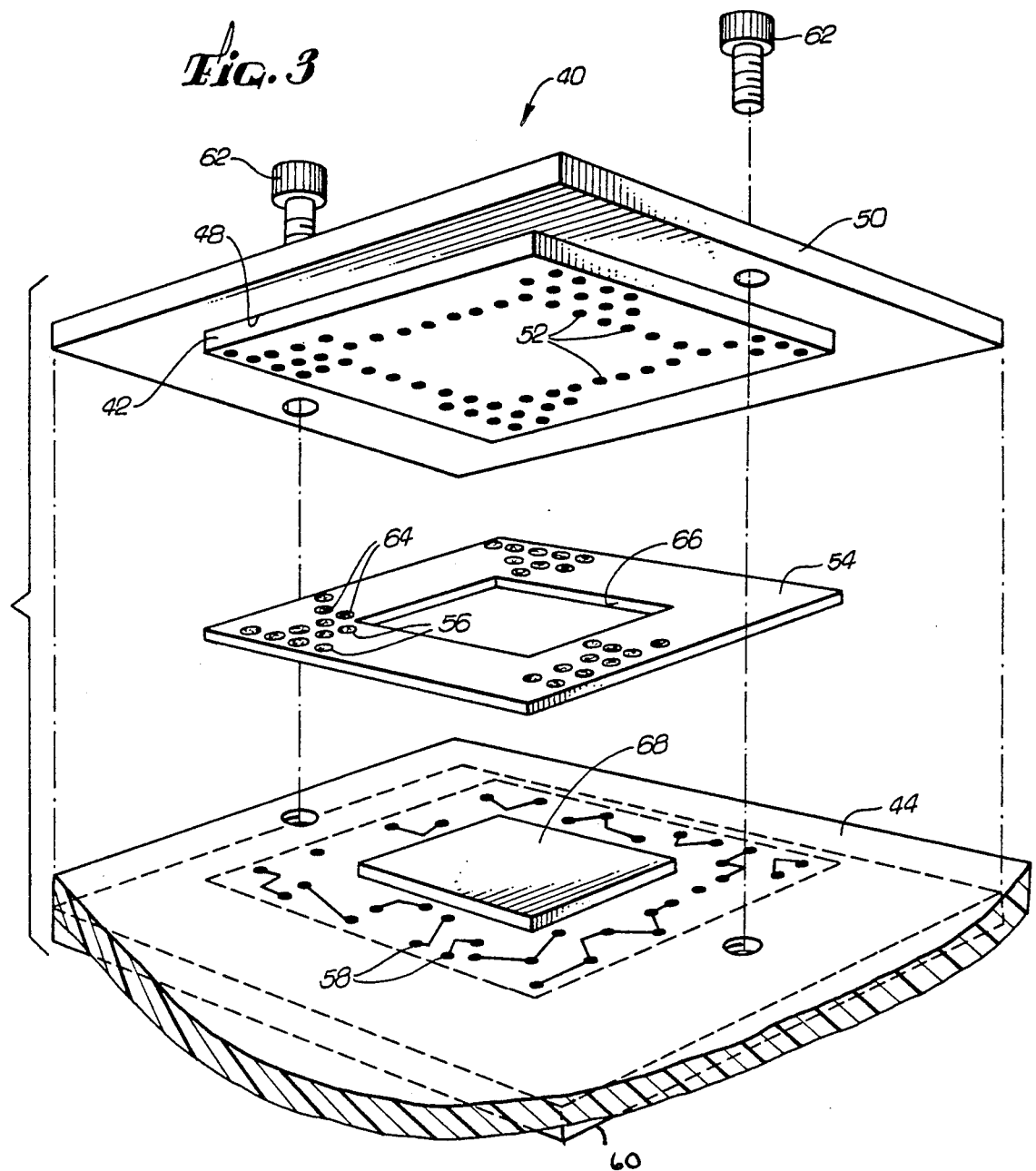
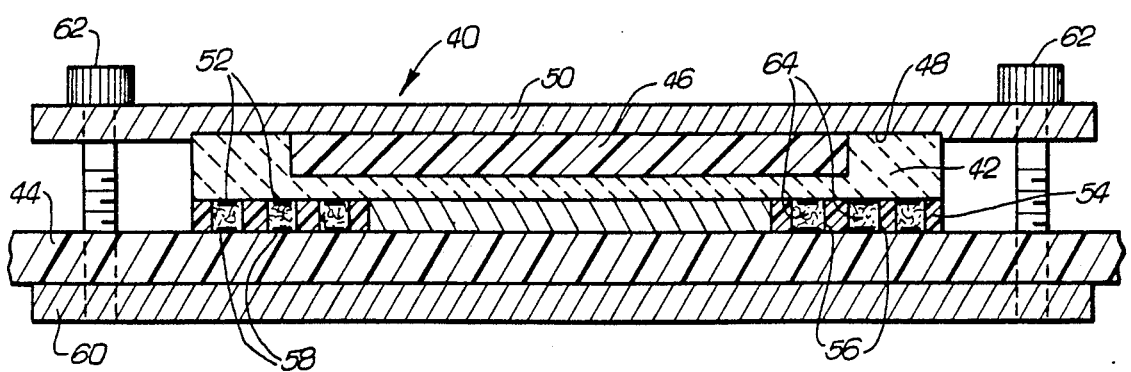

INTEGRATED-CIRCUIT CHIP INTERCONNECTION SYSTEM

This application is a continuation-in-part of earlier filed applications by the same inventor entitled "Button Board Chip Interconnection System," Ser. No. 499,137, filed on May 31, 1983, and subsequently abandoned in favor of this application and "Multi-Element Circuit Construction," Ser. No. 499,136, filed on May 31, 1983, which issued as U.S. Pat. No. 4,574,331 on March 3, 1986 and Ser. No. 737,631 filed May 24, 1985 which issued as U.S. Pat. No. 4,581,679 on Apr. 8, 1986. This application is also related to an earlier application by the same inventor, entitled "Multilayer Circuit Board Interconnection," Ser. No. 482,372, filed Aug. 25, 1965, and subsequently abandoned.

BACKGROUND OF THE INVENTION

This invention relates generally to techniques for packaging circuit elements and, more particularly, to techniques for packaging integrated-circuit (IC) chips.

Conventional packaging techniques utilize ceramic chip packages, multilayer circuit boards and "mother" boards to interconnect large numbers of integrated-circuit chips. The IC chips are generally connected to one of the multilayer printed circuit boards by first mounting and interconnecting the IC chip with a ceramic chip package. This first interconnect is commonly referred to as a Level 1 interconnect. The ceramic chip package is then connected to the multilayer circuit board, known as a Level 2 interconnect. The multilayer printed circuit board is interconnected with other multilayer printed circuit boards by means of the "mother" board, which has connectors into which the circuit boards are plugged. Alternatively, cable harnesses can be utilized to interconnect the multiple printed circuit boards. This final interconnect is commonly referred to as a Level 3 interconnect.

An integrated-circuit chip generally includes thousands of microscopic circuit elements, such as transistors, resistors and capacitors, arranged in various circuit configurations. The circuit elements are interconnected within the IC chip, with the input/output leads of the various circuits connected to conductive areas or pads located around the periphery of the IC chip. A conventional technique for effecting a Level 1 interconnect includes connecting the conductive pads to pins located around the periphery of the ceramic chip package by soldering extremely fine wires between the chip pads and the chip package pins.

This conventional technique for effecting a Level 1 interconnect has many disadvantages. One of the disadvantages is that soldering fine wires between the chip pads and the chip package pins requires expensive tooling and special labor, which is typically available only at a factory. In addition, each interconnection between a chip pad and the multilayer printed circuit board requires four connections, including the two ends of each wire and the two ends of each chip package pin, severely limiting the quality of the connection. Another disadvantage is that the fine wire causes an increase in the interconnect inductance.

The conventional techniques for effecting a Level 2 interconnect utilize various types of IC chip packages, such as dual-in-line (DIP) packages, pin grid arrays and leadless chip packages. A dual-in-line package has pins positioned around the periphery of the chip package that plug into matching receptacles on the multilayer printed circuit board. One problem with this approach is that, because of the large number of input/output leads required by conventional IC chips and the spacing required between the pins, the chip package has an area three to four times the area of the IC chip. This not only limits the number of chips that can be placed on a multilayer printed circuit board, but also increases the distance between the IC chips, significantly increasing signal propagation time. A pin grid array, a chip package having an array of pins extending from the bottom of the chip package, was developed to increase the number of input/output leads without an increase in the chip package size. However, the large number of through holes required in the multilayer printed circuit board to effect the interconnection reduces the interwiring capability of the buried layers, thus requiring a substantial increase in the number of layers. A leadless chip package has contact bumps which are soldered to contact pads on the multilayer printed circuit board. However, the thermal expansion differential between the chip package and the circuit board often shears the solder joints.

The IC chip packages and multilayer printed circuit boards used in conventional packaging techniques present some further problems. One is that the use of a chip package increases the overall capacitance of the system, thus limiting operation of the system at high speeds. Another problem is that the chip package inhibits heat transfer between the IC chip and a heat sink, thus raising the operating temperature of the chip. One problem with using multilayer printed circuit boards is that conventional high speed circuit designs require up to two hundred input/output leads, and future designs could easily extend this requirement to about five hundred leads. Accommodating a modest chip package having 132 leads requires a multilayer printed circuit board with over sixteen layers. Some multilayer circuit boards are presently being manufactured with over thirty-three layers. Circuit boards of this complexity require considerable time to design and manufacture, and a design change of even the simplest nature can result in discarding the whole board.

Another problem with using multilayer printed circuit boards is that they are usually constructed of materials such as epoxy glass, Polymide, or a ceramic material, such as aluminum oxide ($Al_2O_3$). All of these materials have a relatively high dielectric constant, which increases the distributed capacitance of the interconnections to the point that the capacitance can become so high as to require a charging current that is a significant percentage of the total dissipated in the circuitry. Therefore, the distributed capacitance of the interconnections effectively limits the length of the interconnections, if the capacitance values are to be kept within reasonable limits. For typical high speed systems, the circuit boards may have geometric features with widths of approximately 0.007 inches, and spacings with the same dimension. For these geometric values, the distributed capacitance limits the maximum lead length to about 10 to 15 inches. Another and even more important problem caused by the use of these multilayer circuit board materials is the long signal propagation time resulting from the high interconnection reactances, which may render a high speed system completely inoperative or, at the very best, extremely limited in operating speed and data throughput.

The conventional techniques for effecting a Level 3 interconnect, "mother" boards and cable harnesses, also have many disadvantages. One disadvantage of interconnecting the circuit boards with cable harnesses is that the interconnecting cables contribute a large amount of capacitance and inductance, thus limiting operation of the system at high speeds. Insulation material used in the cable harnesses further increases interconnection reactances, thus aggravating the problem. Moreover, the use of cable harnesses can add as much as twenty-five percent to the volume of the system, and can add accordingly to the weight. Another disadvantage is that mother boards and cable harnesses add considerably to the cost of the system. A further disadvantage is that all input and output leads in each multilayer printed circuit board must terminate at an edge of the board, for attachment to one of the back-panel connectors. Therefore, a signal originating at an area of the board remote from the edge connector must weave its way through other conductors and circuit elements on the board. This necessitates long lead lengths and complicates the board design, often requiring unnecessary board layers and a higher density of wiring.

To obviate or minimize the disadvantages and problems arising from the use of conventional interconnection techniques, it has become apparent that a new packaging approach must be employed. The new approach should preferably eliminate the need for many of the conventional interconnection techniques. The new approach should also minimize the lead lengths between interconnected circuits, and provide a correspondingly high packing density that makes more effective use of modern integrated-circuit fabrication techniques. The present invention is directed to these ends.

SUMMARY OF THE INVENTION

The present invention resides in an integrated-circuit (IC) packaging construction for mounting and interconnecting IC chips and IC chip packages with a multilayer printed circuit board and for interconnecting IC chips with minimized interconnection lead lengths between the IC chips. In a presently preferred embodiment of the invention, an IC chip is mounted and interconnected with a multilayer printed circuit board, to effect a Level 2 interconnect, without a ceramic chip package, soldered wires, special tooling or special labor. The IC chip is mounted in a recessed area of a housing, which serves as a heat sink and a hermetic seal for the IC chip. The exposed top face of the IC chip has a plurality of contact areas or pads around the periphery of the chip for connecting the input/output leads of the various circuits within the IC chip to the multilayer circuit board. An insulating board, having a plurality of openings at positions corresponding to the IC chip contact areas, is interposed between the IC chip and the multilayer circuit board. The multilayer circuit board has contact areas at positions corresponding to the openings in the insulating board. Electrical contacts between the IC chip contact areas and the multilayer circuit board contact areas are established by compressing the IC chip toward the multilayer circuit board, thus compressing connector elements positioned in the openings of the insulating board against the contact areas.

The connector elements are preferably each formed as a single strand of wadded wire that protrudes slightly above and below the insulating board and makes electrical contact at multiple points when compressed against a contact area. Connectors of this type have significant advantages over soldered or wire-wrapped connections, and provide connections of high integrity and reliability. In contrast to a soldered connection, this mechanical connector element has very few associated variables that can affect the quality of the connection. The only significant variables are the size of the element and the compressive force used to make the connection, both of which can be accurately controlled.

In another presently preferred embodiment of the invention, an IC chip package is mounted and interconnected with a multilayer printed circuit board, to effect a Level 2 interconnect, without soldering the chip package to the multilayer printed circuit board and without requiring through holes in the multilayer circuit board. The IC chip package is mounted in a recessed area of a housing, which serves as a heat sink for the IC chip package. The exposed bottom face of the IC chip package has a plurality of rows of contact areas or pads around the periphery of the chip package for connecting the input/output leads of the various circuits within the IC chip to the multilayer circuit board. An insulating board, having a plurality of openings at positions corresponding to the IC chip package contact areas, is interposed between the IC chip package and the multilayer circuit board. The multilayer circuit board has contact areas at positions corresponding to the openings in the insulating board. Electrical contacts between the IC chip package contact areas and the multilayer circuit board contact areas are established by compressing the IC chip package toward the multilayer circuit board, thus compressing wadded-wire connector elements positioned in the openings of the insulating board against the contact areas. The insulating board also has a center opening for thermal contact of a heat sink with the bottom of the chip package.

In still another presently preferred embodiment of the invention, a one-dimensional and a three-dimensional packaging construction are employed for interconnecting multiple IC chips with minimum lead lengths. Each IC chip is combined with a heat sink and a multilayer printed circuit board, having face and edge contact areas, to form an IC chip package. Multiple IC chip packages are arranged in chip modules, each module having a plurality of IC chip packages with their faces parallel to a first planar direction. The one-dimensional packaging construction includes a single chip module and the three-dimensional packaging construction includes a three-dimensional array of the chip modules. The IC chip packages, whether in the same chip module or in different chip modules, are interconnected between side-edge contact areas by transverse chip-module interconnection means and between top-edge and bottom-edge contact areas by chip-module layer interconnection means.

The IC chip packages are assembled as in the first preferred embodiment of the invention. Each IC chip, which has a plurality of contact areas around its periphery, is interconnected with a multilayer circuit board by an insulating board. The insulating board has a plurality of openings opposite the IC chip contact areas and the circuit board face-contact areas, with wadded-wire connector elements positioned in the openings. Electrical contacts between the IC chip contact areas and the circuit board face-contact areas are established by compressing the IC chip toward the multilayer circuit board, thus compressing the wadded-wire connector elements against the contact areas.

The transverse chip-module interconnection means includes wadded-wire connector elements, insulating boards and two-sided circuit boards to establish the connections between selected side-edge contact areas of one chip package and selected side-edge contact areas of another chip package in the same chip module or in another chip module. The two-sided circuit board has contact areas on each face for contacting the chip packages and has conductive paths from one side of the board to the other, formed either through or around the edges of the board. Electrical contacts between the chip packages and the two-sided circuit boards are established by means of the wadded-wire connector elements, which are supported by the insulating boards. The transverse chip-module interconnection means has its connecting circuit boards and insulating boards parallel to a second planar direction at right-angles to the first.

In a similar fashion, the connections between selected top-edge or bottom-edge contact areas of one chip package and selected top-edge or bottom-edge contact areas of another chip package in the same chip module or in another chip module are established by the chip-module layer interconnection means. The chip-module layer interconnection means also includes wadded-wire connector elements, insulating boards and two-sided circuit boards. The layer interconnection means extends in a planar direction at right-angles to the other two and extends across the edges of all the chip modules in the same layer, as well as across the edges of the transverse chip-module interconnection means, thus permitting interconnection between all chip modules in the layers above and below the layer interconnection means.

The multilayer circuit boards used in the preferred embodiments of the invention can be either conventional multilayer circuit boards or layer-replaceable multilayer circuit boards using the technique of the present invention. A layer-replaceable circuit board is constructed of alternating layers of two-sided circuit boards and insulating boards with wadded-wire connector elements, as in the transverse chip-module interconnection means and the chip-module layer interconnection means. One of the advantages of the layer-replaceable multilayer circuit board is that the two-sided circuit board can be of materials with a lower dielectric constant than the conventional multilayer circuit board. Another advantage of the layer-replaceable multilayer circuit board is that, because of a small design change, only one layer of the layer-replaceable multilayer circuit board has to be replaced, not the whole multilayer circuit.

The novel construction of the invention eliminates the need for soldering an IC chip to a chip package and a chip package to a multilayer printed circuit board. Consequently, no special tooling or labor is required to connect the IC chip and the IC chip package to the circuit board and, in particular, the IC chip and the IC chip package can be replaced outside of the factory with very simple tools and no special labor. The novel construction of the invention also allows for the elimination of the ceramic chip package. This removes the interconnect inductance of the fine wires used to connect the IC chip with the ceramic chip package and the dielectric capacitance of the ceramic chip package. Elimination of the ceramic chip package also reduces the conventional multiple interconnections between each chip contact area and the multilayer circuit board to just one interconnection, resulting in a higher quality electrical connection. Elimination of the ceramic chip package also removes the main source of resistance to heat transfer between the IC chip and the heat sink. Furthermore, there is no interconnection fanout between the IC chip contact areas and the ultimate connection to the multilayer circuit board, thus dramatically increasing, by three or four times, the number of IC chips that can be mounted on a single multilayer circuit board or packaged in a one-dimensional or three-dimensional packaging construction. This also minimizes lead inductance and capacitance and substantially reduces signal propagation time. Finally, the two-sided circuit boards used in the module interconnection circuitry and in the layer-replaceable multilayer circuit boards can be of materials with lower dielectric constants, further reducing the capacitance of the interconnection circuitry. For conventional designs, these materials are usually rejected as unsuitable for use in multilayer boards because of poor temperature, solderability or lamination performance.

It will be appreciated from the foregoing that the present invention represents a significant advance in the field of packaging of electronic components. Other features and advantages of the present invention will become apparent from the following more detailed description, taken in conjunction with the accompanying drawings, which illustrate, by way of example, the principles of the invention.

BRIEF DESCRIPTION OF THE DRAWINGS

FIG. 3 is a fragmentary perspective view of an IC packaging construction for mounting and interconnecting an IC chip package with a multilayer printed circuit board using the technique of the invention;

FIG. 4 is a fragmentary sectional view of an IC chip package mounted and interconnected with a multilayer circuit board using the technique of the invention;

DESCRIPTION OF THE PREFERRED EMBODIMENTS

Figure 1:
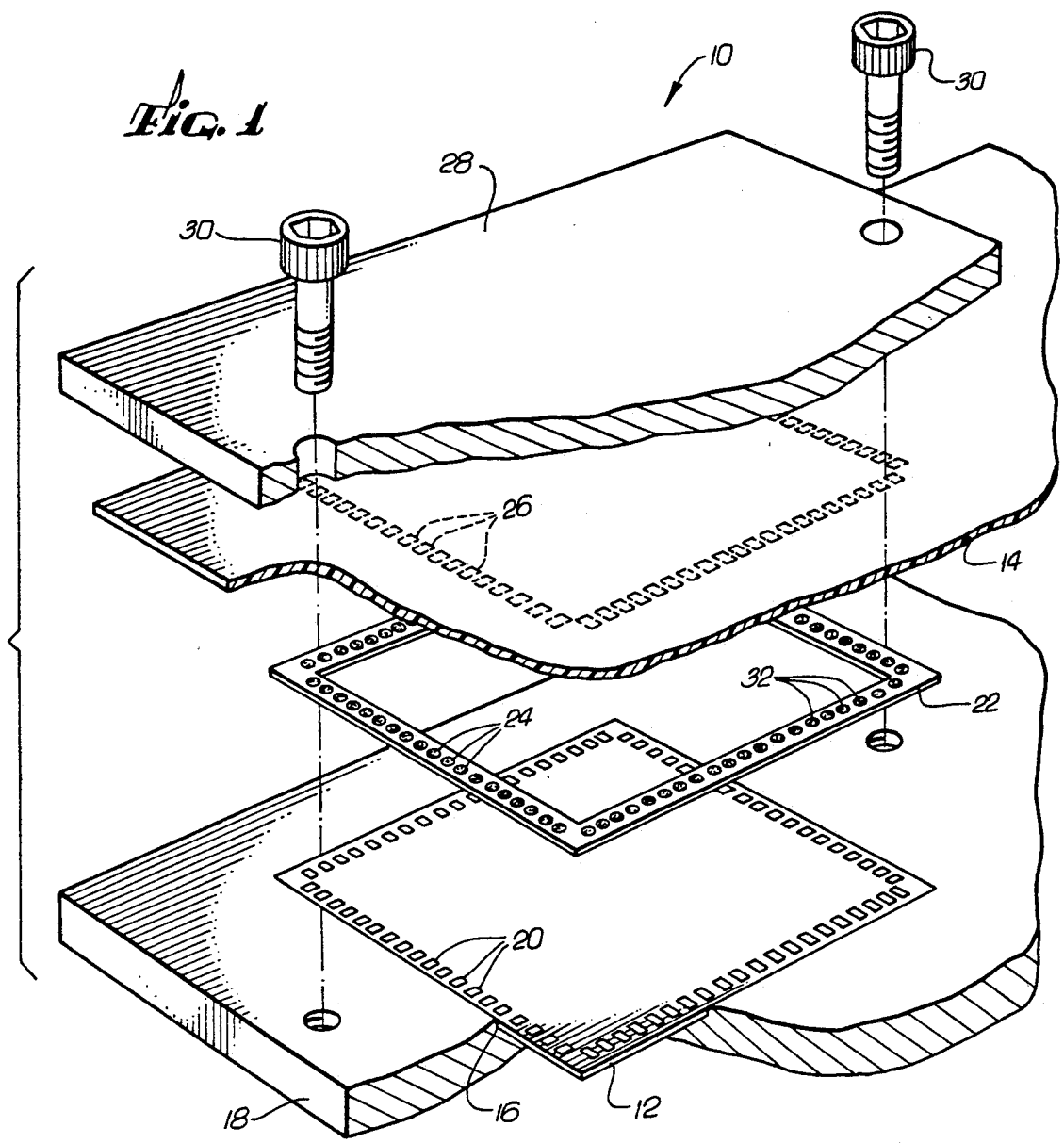
FIG. 1 is a fragmentary perspective view of an IC packaging construction for mounting and interconnecting an IC chip with a multilayer printed circuit board using the technique of the invention.

As shown in the drawings for purposes of illustration, the present invention is embodied in an integrated-circuit (IC) packaging construction for mounting and interconnecting IC chips and IC chip packages with a multilayer printed circuit board and for interconnecting IC chips with minimized interconnection lead lengths between the IC chips. FIG. 1 illustrates an IC chip packaging construction 10 for mounting and interconnecting an IC chip 12 with a multilayer printed circuit board 14, to effect a Level 2 interconnect, without a ceramic chip package, soldered wires, special tooling or special labor. The IC chip 12 is mounted in a recessed area 16 of a housing 18, the housing 18 serving as a heat sink and a hermetic seal for the IC chip 12. The exposed top face of the IC chip 12 has a plurality of thin-film metalization contact areas or pads 20 around the periphery of the chip 12 for connecting the input/output leads of the various circuits within the IC chip 12 to the multilayer circuit board 14. An insulating board 22, commonly referred to as a button board, is interposed between the IC chip 12 and the multilayer circuit board 14. The insulating board 22 fits in the recessed area 16 of the housing 18 over the top surface of the IC chip 12.

Figure 2:
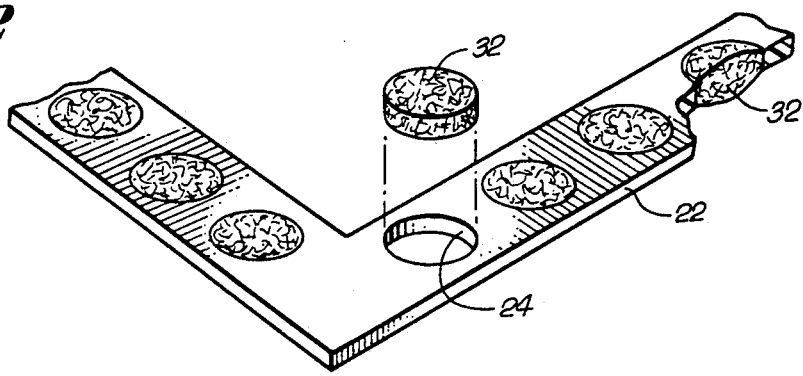
FIG. 2 is a fragmentary, exploded perspective view of an insulating board with a plurality of wadded-wire connector elements.

As shown more clearly in FIG. 2, the insulating board 22 has a plurality of circular openings 24 at positions corresponding to the IC chip contact areas 20. The multilayer circuit board 14 has contact areas 26 at positions corresponding to the openings 24 in the insulating board 22. Electrical contacts between the IC chip contact areas 20 and the multilayer circuit board contact areas 26 are established by compressing the IC chip 12 toward the multilayer circuit board 14 with a clamp 28 and two bolts 30, thus compressing connector elements 32 positioned in the openings 24 of the insulating board 22 against the IC chip contact areas 20 and the multilayer circuit board contact areas 26.

The insulating board or button board 22 is preferably formed from an insulating material, such as glass ceramic. The connector elements 32 are preferably each formed from a single strand of metal wire, each strand being wadded together to form a nearly cylindrical "button" of material having a density of between twenty and thirty percent. Each wadded-wire connector element 32 protrudes slightly above and below the insulating board 22 and makes electrical contact at multiple points when compressed against a contact area. Connectors of this type have significant advantages over soldered or wire-wrapped connections, and provide connections of high integrity and reliability. In contrast to a soldered connection, this mechanical connector element has very few associated variables that can affect the quality of the connection. The only significant variables are the size of the element and the compressive force used to make the connection, both of which can be accurately controlled.

The wadded-wire connector elements 32 employed in the illustrative embodiments are fabricated using approximately 0.0003 inch nickel wire. The nickel wire is wadded into a nearly cylindrical button to fit snugly into a 0.003 to 0.005 inch diameter opening in the insulating board 22. The wadded-wire connector elements 32 can also be fabricated from such alloys as beryllium and copper, silver and copper, or phosphorous and bronze. The wadded-wire connector elements 32 protrude above and below the insulating board 22 approximately 0.001 to 0.002 inches. Each wadded-wire connector element 32, when under compression, makes multiple contacts with a contact pad, and provides multiple conductive paths. In addition, each contact made by the wadded-wire connector element 32 is at very high pressure, because of the type of spring formed by the wadded wire and the small area of each contact point. In the embodiments described, the wadded-wire connector elements 32 are manufactured by Technical Wire Products, Inc. of Piscataway, New Jersey, under the trademark Fuzz Button.

The compression of the wadded-wire connector elements 32 is substantially elastic so that, when the compressive force of the clamp 28 is removed, the wadded-wire connector elements 32 return to their original shape. This allows the IC chip 12 to be removed and replaced and the wadded-wire connector elements 32 and the insulating board 22 used again. The IC chip 12 is easily removed by releasing the clamp bolts 30 and removing the clamp 28, the multilayer printed circuit board 14 and the insulating board 22. The IC chip 12 is then removed and replaced and the foregoing procedure reversed.

FIGS. 3 and 4 illustrate an IC chip packaging construction 40 for mounting and interconnecting an IC chip package 42 with a multilayer printed circuit board 44, to effect a Level 2 interconnect, without soldering the chip package 42 to the multilayer printed circuit board 44 and without requiring through holes in the multilayer printed circuit board 44. The IC chip package 42 includes an IC chip 46 mounted and interconnected by conventional means within the chip package 42. The IC chip package 42 is mounted in a recessed area 48 of a housing 50, the housing 50 serving as a heat sink for the IC chip package 42. The exposed bottom face of the IC chip package 42 has a plurality of rows of thin-film metalization contact areas or pads 52 around the periphery of the chip package 42 for connecting the input/output leads of the various circuits within the IC chip 46 to the multilayer circuit board 44.

An insulating board 54, having a plurality of openings 56 at positions corresponding to the chip package contact areas 52, is interposed between the IC chip package 42 and the multilayer circuit board 44. The multilayer circuit board 44 has contact areas 58 at positions corresponding to the openings 56 in the insulating board 54. Electrical contacts between the IC chip package contact areas 52 and the multilayer circuit board contact areas 58 are established by compressing the IC chip package 42 toward the multilayer circuit board 44 with a clamp 60 and two bolts 62, thus compressing wadded-wire connector elements 64 positioned in the openings 56 of the insulating board 54 against the IC chip package contact areas 52 and the multilayer circuit board contact areas 58. The insulating board 54 also has a center opening 66 for thermal contact of a heat sink 68 with the bottom of the chip package 42. The IC chip package 42 can be removed and replaced in the same fashion as the IC chip 12.

Figure 5:
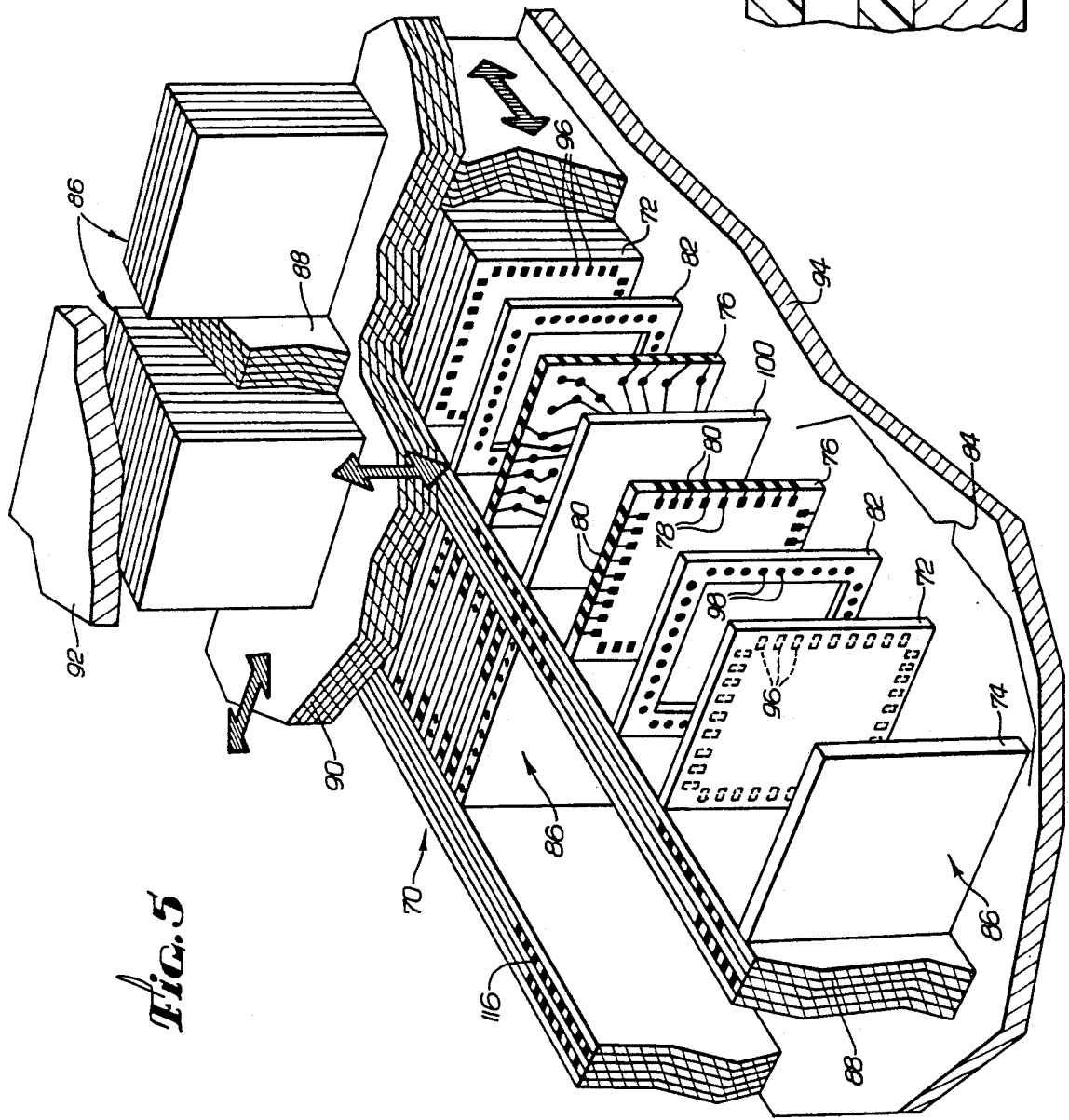
FIG. 5 is fragmentary perspective view of a three-dimensional packaging construction for interconnecting IC chips with minimized interconnection lead lengths between the IC chips using the technique of the invention.

FIG. 5 illustrates a three-dimensional IC packaging construction 70 for interconnecting multiple IC chips with minimized interconnection lead lengths. In the illustrated construction, a plurality of IC chips 72 are disposed in a parallel relationship and interconnected in various ways to be described. Each IC chip 72 is combined with a heat sink 74, a multilayer printed circuit board 76 having face contact areas 78 and edge contact areas 80, and an insulating board or button board 82 to form an IC chip package 84. Multiple IC chip packages 84 are arranged in IC chip modules 86, each module 86 having a plurality of IC chip packages 84 with their faces parallel to a first planar direction. The one-dimensional IC chip packaging construction includes a single chip module 86. The IC chip packages 84, whether in the same chip module or in different chip modules, are interconnected between side-edge contact areas 80 by transverse chip-module interconnection means 88 and between top-edge and bottom-edge contact areas 80 by chip-module layer interconnection means 90. The heat sinks 74 make thermal contact with upper and lower heat sinks 92,94.

Figure 6:
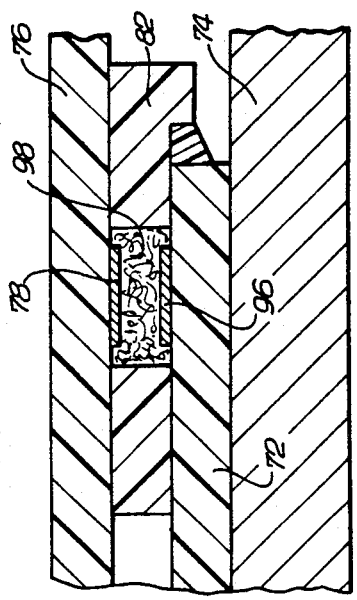
FIG. 6 is an enlarged fragmentary sectional view of an IC chip mounted and interconnected with a multilayer circuit board using the technique of the invention.

As shown in FIGS. 5 and 6, the IC chip packages 84 are assembled as in the first preferred embodiment of the invention. Each IC chip 72, which has a plurality of contact areas 96 around its periphery, is interconnected with the multilayer circuit board 76 by the insulating board or button board 82. The insulating board 82 has a plurality of openings opposite the IC chip contact areas 96 and the circuit board face-contact areas 78, with wadded-wire connector elements 98 positioned in the openings. Electrical contacts between the IC chip contact areas 96 and the circuit board face-contact areas 78 are established by compressing the IC chip 72 toward the multilayer circuit board 76, thus compressing the wadded-wire connector elements 98 against the contact areas 78, 96. The IC chip packages 84 are insulated from each other by a spacer board 100.

Figure 7:
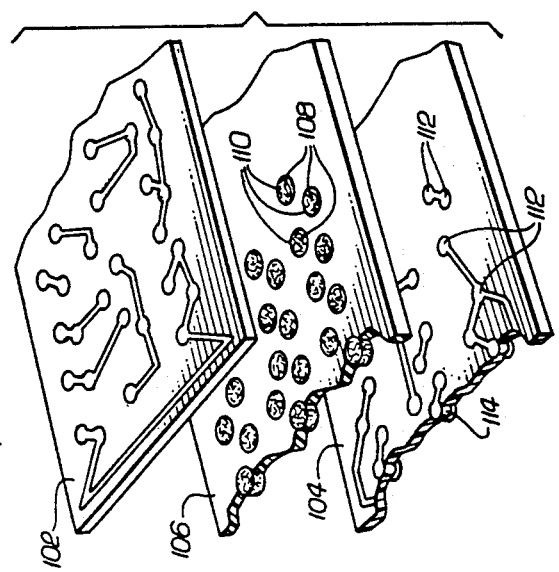
FIG. 7 is a fragmentary, exploded perspective view of the interconnection of two circuit boards using the technique of the invention.

As shown in FIGS. 5 and 7, the transverse chip-module interconnection means 88 includes alternating layers of two-sided circuit boards 102, 104 and insulating boards 106 to establish the connections between selected side-edge contact areas 80 of one chip package 84 and selected side-edge contact areas of another chip package in the same chip module 86 or in another chip module. The transverse chip-module interconnection means 88 includes at least two two-sided circuit boards 102, 104 and three insulating boards 106, with the insulating boards 106 having wadded-wire connector elements 108 positioned in openings 110. The two-sided circuit boards 102, 104 have contact areas 112 on each face for contacting the side-edge contact areas 80 of the chip packages 84 and have conductive paths 114 from one side of each board to the other, formed either through or around the edges of the board. Electrical contacts between the chip packages 84 and the two-sided circuit boards 102, 104 are established by means of the wadded-wire connector elements 108. The transverse chip-module interconnection means 88 has its connecting circuit boards 102, 104 and insulating boards 106 parallel to a second planar direction at right-angles to the first.

In a similar fashion, the connections between selected top-edge or bottom-edge contact areas 80 of one chip package 84 and selected top-edge or bottom-edge contact areas of another chip package in the same chip module 86 or in another chip module are established by the chip-module layer interconnection means 90. The chip-module layer interconnection means 90 also includes alternating layers of two-sided circuit boards 102, 104 and insulating boards 106, with the insulating boards 106 having wadded-wire connector elements 10B positioned in the openings 110. The layer interconnection means 90 extends in a planar direction at right-angles to the other two and extends across the edges of all the chip modules 86 in the same layer, as well as across the edges of the transverse chip-module interconnection means 88, which also have edge contact areas 116, thus permitting interconnection between all chip modules 86 in the layers above and below the layer interconnection means 90.

The multilayer circuit boards 14, 44, 76 used in the preferred embodiments of the invention can be either conventional multilayer circuit boards or layer-replaceable multilayer circuit boards using the technique of the present invention. A layer-replaceable circuit board is comprised of alternating layers of two-sided circuit boards 102, 104 and insulating boards 106 with wadded-wire connector elements 108, as in the transverse chip-module interconnection means 88 and the chip-module layer interconnection means 90. One of the advantages of the layer-replaceable multilayer circuit board is that the two-sided circuit board can be of materials with a lower dielectric constant than the conventional multilayer circuit board. Another advantage of the layer-replaceable multilayer circuit board is that, because of a small design change, only one layer of the layer-replaceable multilayer circuit board has to be replaced, not the whole multilayer circuit.

From the foregoing, it will be appreciated that the present invention represents a significant advance over the packaging techniques of the prior art. In particular, the novel construction of the invention eliminates the need for soldering an IC chip to a chip package and a chip package to a multi layer printed circuit board. Consequently, no special tooling or labor is required to connect the IC chip and the IC chip package to the circuit board and, in particular, the IC chip and the IC chip package can be replaced outside of the factory with very simple tools and no special labor. The novel construction also allows for the elimination of the ceramic chip package. This removes the interconnect inductance of the fine wires used to connect the IC chip with the ceramic chip package and the dielectric capacitance of the ceramic chip package. Elimination of the ceramic chip package also reduces the conventional multiple interconnections between each chip contact area and the multilayer circuit board to just one interconnection, resulting in a higher quality electrical connection. Elimination of the ceramic chip package also removed the main source of resistance to heat transfer between the IC chip and the heat sink. Furthermore, there is no interconnection fanout between the IC chip contact areas and the ultimate connection to the multilayer circuit board, thus dramatically increasing, by three or four times, the number of IC chips that can be mounted on a single multilayer circuit board or packaged in a one-dimensional or three-dimensional packaging construction. This also minimized lead inductance and capacitance and substantially reduces signal propagation time. Finally, the two-sided circuit boards used in the module interconnection circuitry and in the layer-replaceable multilayer circuit boards can be of materials with lower dielectric constants, further reducing the capacitance of the interconnection circuitry. For conventional designs, these materials are usually rejected as unsuitable for use in multilayer boards because of poor temperature, solderability or lamination performance. Although several preferred embodiments of the invention have been shown and described, it will be apparent that other adaptations and modifications can be made without departing from the spirit and scope of the invention. Accordingly, the invention is not to be limited, except as by the following claims.

I claim:

1. An integrated-circuit (IC) chip packaging construction, comprising:
   an integrated circuit chip having a plurality of contact areas;
   a rigid insulating board having a plurality of openings therethrough, with at least some of the openings at positions corresponding to the IC chip contact areas;
   a circuit board having contact areas at positions corresponding to some of the openings in the insulating board;

a plurality of conductive connector elements disposed in selected ones of the openings in the insulating board, each of said connector elements including a wadded strand of conductive wire that is deformed when compressed and makes multiple electrical contacts with the IC chip and circuit board contact areas; and means for compressing the IC chip toward the circuit board, thereby compressing the connector elements and making electrical contact between the IC chip contact areas and the circuit board contact areas.

2. A packaging construction as set forth in claim 1, wherein the circuit board is a multilayer printed circuit board.

3. A packaging construction as set forth in claim 1, wherein the circuit board is a layer-replaceable multilayer circuit board.

4. A packaging construction as set forth in claim 3, wherein the layer-replaceable multilayer circuit board includes:

a plurality of two-sided circuit boards, each circuit board having a plurality of contact areas on both sides of the circuit board and selected connections between the contact areas;

an insulating board with openings therethrough located between adjacent two-sided circuit boards, with at least some of the openings at positions corresponding to the two-sided circuit board contact areas; and a plurality of conductive connector elements disposed in selected ones of the openings in the insulating board to make electrical contact between the two-sided circuit board contact areas.

5. A packaging construction as set forth in claim 4, wherein:

of the connector elements includes a wadded strand of conductive wire that is deformed when compressed between the two-sided circuit board contact areas and makes multiple electrical contacts between the contact areas.

6. A packaging construction as set forth in claim 1, and further including a housing having a recessed area for the IC chip, the housing serving as both a heat sink and a hermetic seal for the IC chip.

7. A packaging construction as set forth in claim 1, wherein the means for compressing includes a clamp mechanism.

8. A packaging construction as set forth in claim 1, wherein the insulating board is fabricated from a glass ceramic.

9. A packaging construction as set forth in claim 1, wherein each wadded strand of wire has a density of approximately 20 to 30 percent.

10. A packaging construction as set forth in claim 1, wherein each wadded strand of wire extends slightly above and below the insulating board.

11. A packaging construction as set forth in claim 1, wherein each wadded strand of wire extends approximately 0.001 inches above and below the insulating board.

12. A packaging construction as set forth in claim 1, wherein each wadded strand of wire is a nickel wire having a diameter of approximately 0.0003 to 0.0005 inches.

13. A packaging construction as set forth in claim 1, wherein each wadded strand of wire is an alloy wire having a diameter of approximately 0.0003 to 0.0005 inches, wherein the alloy is selected from the group consisting of beryllium and copper, silver and copper, and phosphorous and bronze.

14. An integrated-circuit (IC) chip packaging construction, comprising:

an integrated circuit chip package having a plurality of contact areas;

an integrated circuit chip mounted in the IC chip package;

a rigid insulating board having a plurality of openings therethrough, with at least some of the openings at positions corresponding to the IC chip package contact areas;

a circuit board having contact areas at positions corresponding to some of the openings in the insulating board;

a plurality of conductive connector elements disposed in selected ones of the openings in the insulating board, each of said connector elements including a wadded strand of conductive wire that is deformed when compressed and makes multiple electrical contacts with the IC chip package and circuit board contact areas; and means for compressing the IC chip package toward the circuit board, thereby compressing the connector elements and making electrical contact between the IC chip package contact areas and the circuit board contact areas;

wherein the circuit board is a multilayer printed circuit board.

15. A packaging construction as set forth in claim 14, wherein the circuit board is a layer-replaceable multilayer circuit board.

16. A packaging construction as set forth in claim 15, wherein the layer-replaceable multilayer circuit board includes:

a plurality of two-sided circuit boards, each circuit board having a plurality of contact areas on both sides of the circuit board and selected connections between the contact areas;

an insulating board with openings therethrough located between adjacent two-sided circuit boards, with at least some of the openings at positions corresponding to the two-sided circuit board contact areas; and a plurality of conductive connector elements disposed in selected ones of the openings in the insulating board to make electrical contact between the two-sided circuit board contact areas.

17. A packaging construction as set forth in claim 16, wherein:

of the connector elements includes a wadded strand of conductive wire that is deformed when compressed between the two-sided circuit board contact areas and makes multiple electrical contacts between the contact areas.

18. A packaging construction as set forth in claim 14, and further including a housing having a recessed area for the IC chip package, the housing serving as a heat sink for the IC chip package.

19. A one-dimensional integrated-circuit (IC) chip packaging construction, comprising:

an IC chip having a plurality of contact areas;

IC chip mounting and interconnection means having face and edge contact areas and selected connections between the face and edge contact areas, the IC chip and the IC chip mounting and interconnecting means forming an IC chip package;

at least one additional IC chip package of similar construction to the first IC chip package arrayed in a parallel relationship with the first IC chip package; and means for interconnecting selected ones of the edge contact areas of different chip packages;

wherein the IC chip mounting and interconnection means includes:

an insulating board having a plurality of openings therethrough, with at least some of the openings at positions corresponding to the IC chip contact areas;

a circuit board having face and edge contact areas and selected connections between the face and edge contact areas, with at least some of the face contact areas at positions corresponding to the openings in the insulating board;

a plurality of conductive connector elements disposed in selected ones of the openings in the insulating board to make electrical contact between the IC chip contact areas and the circuit board face-contact areas; and means for applying compressive forces to the IC chip, the insulating board and the circuit board, to force the connector elements into contact with the IC chip contact areas and the circuit board face-contact areas.

20. A packaging construction as set forth in claim 19, wherein:

each of the connector elements includes a wadded strand of conductive wire that is deformed when compressed between the contact areas and makes multiple electrical contacts between the contact areas.

21. A packaging construction as set forth in claim 19, wherein the circuit board is a multilayer printed circuit board.

22. A one-dimensional integrated circuit (IC) chip packaging construction, comprising:

an IC chip having a plurality of contact areas;

IC chip mounting and interconnection means having face and edge contact areas and selected connections between the face and edge contact areas, the IC chip and the IC chip mounting and interconnecting means forming an IC chip package, the IC chip mounting and interconnection means including:

an insulating board having a plurality of openings therethrough, with at least some of the openings at positions corresponding to the IC chip contact areas;

a multilayer printed circuit board having face and edge contact areas and selected connections between the face and edge contact areas, with at least some of the face contact areas at positions corresponding to the openings in the insulating board, the multilayer printed circuit board including:

a plurality of two-sided circuit boards, each circuit board having a plurality of contact areas on both sides of the circuit board and selected connections between the contact areas;

one or more insulating boards with openings therethrough, with at least some of the openings at positions corresponding to the two-sided circuit board contact areas; and a plurality of conductive connector elements disposed in selected ones of the openings in the insulating boards to make electrical contact between the two-sided circuit board contact areas;

wherein the two-sided circuit boards are alternated with the insulating boards to effect a layer-replaceable multilayer circuit board;

a plurality of conductive connector elements disposed in selected ones of the openings in the insulating board to make electrical contact between the IC chip contact areas and the circuit board face-contact areas; and means for applying compressive force to the IC chip, the insulating board and the circuit board, to force the connector elements into contact with the IC chip contact areas and the circuit board face-contact areas;

at least one additional IC chip package of similar construction to the first IC chip package arrayed in a parallel relationship with the first IC chip package; and means for interconnecting selected ones of the edge contact areas of different chip packages.

23. A packaging construction as set forth in claim 22, wherein:

each of the connector elements includes a wadded strand of conductive wire that is deformed when compressed between the contact areas and makes multiple electrical contacts between the contact areas.

24. A one-dimensional integrated-circuit (IC) chip packaging construction, comprising:

an IC chip having a plurality of contact areas;

IC chip mounting and interconnection means having face and edge contact areas and selected connections between the face and edge contact areas, the IC chip and the IC chip mounting and interconnecting means forming an IC chip package;

at least one additional IC chip package of similar construction to the first IC chip package arrayed in a parallel relationship with the first IC chip package; and means for interconnecting selected ones of the edge contact areas of different chip packages;

wherein the means for interconnecting selected ones of the edge contact areas includes:

at least one insulating board with openings therethrough, with at least some of the openings corresponding to the edge contact areas;

at least one two-sided circuit board having contact areas corresponding to at least some of the openings in the insulating board and having selected connections between the contact areas;

a plurality of conductive connector elements disposed in selected ones of the openings in the insulating board to make electrical contact with the edge contact areas; and means for applying compressive force to the two-sided circuit board and the insulating board, to force the connector elements into contact with the edge contact areas and the two-sided circuit board contact areas.

25. A packaging construction as set forth in claim 24, wherein:

each of the connector elements includes a wadded strand of conductive wire that is deformed when compressed between the contact areas and makes multiple electrical contacts between the contact areas.

26. A packaging construction as set forth in claim 19, wherein the insulating board is fabricated from a glass ceramic.

27. A packaging construction as set forth in claim 25, wherein each wadded strand of wire has a density of approximately 20 to 30 percent.

28. A packaging construction as set forth in claim 20, wherein each wadded strand of wire extends slightly above and below the insulating board.

29. A packaging construction as set forth in claim 20, wherein each wadded strand of wire extends approximately 0.001 inches above and below the insulating board.

30. A packaging construction as set forth in claim 20, wherein each wadded strand of wire is a nickel wire having a diameter of approximately 0.0003 to 0.0005 inches.

31. A packaging construction as set forth in claim 20, wherein each wadded strand of wire is an alloy wire having a diameter of approximately 0.0003 to 0.0005 inches, wherein the alloy is selected from the group consisting of beryllium and copper, silver and copper, and phosphorous and bronze.

32. A three-dimensional integrated-circuit packaging construction, comprising:
   an IC chip having a plurality of contact areas;
   IC chip mounting and interconnection means having face and edge contact areas and selected connections between the face and edge contact areas, the IC chip and the IC chip mounting and interconnecting means forming an IC chip package;
   at least one additional IC chip package of similar construction to the first IC chip package arrayed in a parallel relationship with the first IC chip package to form a first IC chip module;
   at least one additional IC chip module of similar construction to the first IC chip module;
   transverse chip-module interconnection means disposed between the first and the additional IC chip modules, and between any other adjacent pairs of IC chip modules, to establish selected connections between the edge contact areas, the transversely interconnected IC chip modules forming a first IC chip module layer;
   at least one additional IC chip module layer of similar construction to the first IC chip module layer; and
   chip-module layer interconnection means disposed between the first and the additional IC chip module layers, and between any other adjacent pairs of IC chip module layers, to establish selected connections between the edge contact areas;
   whereby interconnections between the IC chips may be made in any of three dimensions, and the current path lengths within the interconnections are minimized.

33. A packaging construction as set forth in claim 32, wherein the IC chip mounting and interconnection means includes:
   an insulating board having a plurality of openings therethrough, with at least some of the openings at positions corresponding to the IC chip contact areas;
   a circuit board having face and edge contact areas and selected connections between the face and edge contact areas, with at least some of the face contact areas at positions corresponding to the openings in the insulating board;
   a plurality of conductive connector elements disposed in selected ones of the openings in the insulating board to make electrical contact between the IC chip contact areas and the circuit board face-contact areas; and
   means for applying compressive force to the IC chip, the insulating board and the circuit board, to force the connector elements into contact with the IC chip contact areas and the circuit board face-contact areas.

34. A packaging construction as set forth in claim 33, wherein:
   each of the connector elements includes a wadded strand of conductive wire that is deformed when compressed between the contact areas and makes multiple electrical contacts between the contact areas.

35. A packaging construction as set forth in claim 33, wherein the circuit board is a multilayer printed circuit board.

36. A three-dimensional integrated-circuit packaging construction, comprising:
   an IC chip having a plurality of contact areas;
   IC chip mounting and interconnection means having face and edge contact areas and selected connections between the face and edge contact areas, the IC chip mounting and interconnection means including:
      an insulating board having a plurality of openings therethrough, with at least some of the openings at positions corresponding to the IC chip contact areas;
      a multilayer printed circuit board having face and edge contact areas and selected connections between the face and edge contact areas, with at least some of the face contact areas at positions corresponding to the openings in the insulating board, the multilayer printed circuit board including:
         a plurality of two-sided circuit boards, each circuit board having a plurality of contact areas on both sides of the circuit board and selected connections between the contact board;
         one or more insulating boards with openings therethrough, with at least some of the openings at positions corresponding to the two-sided circuit board contact areas; and
         a plurality of conductive connector elements disposed in selected ones of the openings in the insulating boards to make electrical contact between the two-sided circuit board contact areas;
   wherein the two-sided circuit boards are alternated with the insulating boards to effect a layer-replaceable multilayer circuit board;
      a plurality of conductive connector elements disposed in selected ones of the openings in the insulating board to make electrical contact between the IC chip contact areas and the circuit board face-contact areas; and
      means for applying compressive force to the IC chip, the insulating board and the circuit board, to force the connector elements into contact with the IC chip contact areas and the circuit board face-contact areas, thus forming an IC chip package;
   at least one additional IC chip package of similar construction to the first IC chip package arrayed in a parallel relationship with the first IC chip package to form a first IC chip module;

at least one additional IC chip module of similar construction to the first IC chip module;

transverse chip-module interconnection means disposed between the first and the additional IC chip modules, and between any other adjacent pairs of IC chip modules, to establish selected connections between the edge contact areas, the transversely interconnected IC chip modules forming a first IC chip module layer;

at least one additional IC chip module layer of similar construction to the first IC chip module layer; and chip-module layer interconnection means disposed between the first and the additional IC chip module layers, and between any other adjacent pairs of IC chip module layers, to establish selected connections between the edge contact areas;

whereby interconnections between the IC chips may be made in any of three dimensions, and the current path lengths within the interconnections are minimized.

37. A packaging construction as set forth in claim 36, wherein:
each of the connector elements includes a wadded strand of conductive wire that is deformed when compressed between the contact areas and makes multiple electrical contacts between the contact areas.

38. A three-dimensional integrated-circuit packaging construction, comprising:
an IC chip having a plurality of contact areas;
IC chip mounting and interconnection means having face and edge contact areas and selected connections between the face and edge contact areas, the IC chip and the IC chip mounting and interconnecting means forming an IC chip package;
at least one additional IC chip package of similar construction to the first IC chip package arrayed in a parallel relationship with the first IC chip package to form a first IC chip module;
at least one additional IC chip module of similar construction to the first IC chip module;
transverse chip-module interconnection means disposed between the first and the additional IC chip modules, and between any other adjacent pairs of IC chip modules, to establish selected connections between the edge contact areas, the transversely interconnected IC chip modules forming a first IC chip module layer;
at least one additional IC chip module layer of similar construction to the first IC chip module layer; and
chip-module layer interconnection means disposed between the first and the additional IC chip module layers, and between any other adjacent pairs of IC chip module layers, to establish selected connections between the edge contact areas;
wherein the transverse chip-module interconnection means and the chip-module layer interconnection means each includes:
at least one insulating board with openings therethrough, with at least some of the openings corresponding to the edge contact areas;
a plurality of conductive connector elements disposed in selected ones of the openings in the insulating board to make electrical contact with the edge areas; and
means for applying compressive force to the insulating board, to force the connector elements into contact with the edge contact areas;
whereby interconnections between the IC chips may be made in any of three dimensions, and the current path lengths within the interconnections are minimized.

39. A packaging construction as set forth in claim 38, wherein:
each of the connector elements includes a wadded strand of conductive wire that is deformed when compressed between the contact areas and makes multiple electrical contacts between the contact areas.

40. A packaging construction as set forth in claim 38, wherein the transverse chip-module interconnection means and the chip-module layer interconnection means each further includes:
at least one two-sided circuit board located between two of the insulating boards and having contact areas corresponding to at least some of the openings in the insulating boards, and having selected connections between the contact areas.

41. A packaging construction as set forth in claim 40, wherein:
each of the connector elements includes a wadded strand of conductive wire that is deformed when compressed between the contact areas and makes multiple electrical contacts between the contact areas.

42. A packaging construction as set forth in claim 32, and further including a heat sink in thermal contact with the IC chip.

43. A three-dimensional integrated-circuit (IC) chip packaging construction, comprising:
an IC chip having a plurality of contact areas;
IC chip mounting and interconnection means having face and edge contact areas and selected connections between the face and edge contact areas, the IC chip and the IC chip mounting and interconnecting means forming an IC chip package, the IC chip mounting and interconnection means including:
an insulating board having a plurality of openings therethrough, with at least some of the openings at positions corresponding to the IC chip contact areas;
a circuit board having face and edge contact areas and selected connections between the face and edge contact areas, with at least some of the face contact areas at positions corresponding to the openings in the insulating board;
a plurality of conductive connector elements disposed in selected ones of the openings in the insulating board to make electrical contact between the IC chip contact areas and the circuit board face-contact areas; and
means for applying compressive force to the IC chip, the insulating board and the circuit board, to force the connector elements into contact with the IC chip contact areas and the circuit board face-contact areas;
at least one additional IC chip package of similar construction to the first IC chip package arrayed in a parallel relationship with the first IC chip package to form a first IC chip module;
at least one additional IC chip module of similar construction to the first IC chip module;

transverse chip-module interconnection means disposed between the first and the additional IC chip modules, and between any other adjacent pairs of IC chip modules, to establish selected connections between the edge contact areas, the transversely interconnected IC chip modules forming a first IC chip module layer;

at least one additional IC chip module layer of similar construction to the first IC chip module layer; and chip-module layer interconnection means disposed between the first and the additional IC chip module layers, and between any other adjacent pairs of IC chip module layers, to establish selected connections between the edge contact areas, the transverse chip-module interconnection means and the chip-module layer interconnection means each including:

at least one insulating board with openings therethrough, with at least some of the openings corresponding to the edge contact areas;

a plurality of conductive connector elements disposed in selected ones of the openings in the insulating board to make electrical contact with the edge contact areas; and means for applying compressive force to the insulating board, to force the connector elements into contact with the edge contact areas;

whereby interconnections between the IC chips may be made in any of three dimensions, and the current path lengths within the interconnections are minimized.

44. A packaging construction as set forth in claim 43, wherein:
each of the connector elements includes a wadded strand of conductive wire that is deformed when compressed between the contact areas and makes multiple electrical contacts between the contact areas.

45. A packaging construction as set forth in claim 43, wherein the transverse chip-module interconnection means and the chip-module layer interconnection means each further includes:
at least one two-sided circuit board located between two of the insulating boards and having contact areas corresponding to at least some of the openings in the insulating boards, and having selected connections between the contact areas.

46. A packaging construction as set forth in claim 45, wherein:
each of the connector elements includes a wadded strand of conductive wire that is deformed when compressed between the contact areas and makes multiple electrical contacts between the contact areas.

47. A packaging construction as set forth in claim 33, wherein the insulating board is fabricated from a glass ceramic.

48. A packaging construction as set forth in claim 34, wherein each wadded strand of wire has a density of approximately 20 to 30 percent.

49. A packaging construction as set forth in claim 34, wherein each wadded strand of wire extends slightly above and below the insulating board.

50. A packaging construction as set forth in claim 34, wherein each wadded strand of wire extends approximately 0.001 inches above and below the insulating board.

51. A packaging construction as set forth in claim 34, wherein each wadded strand of wire is a nickel wire having a diameter of approximately 0.0003 to 0.0005 inches.

52. A packaging construction as set forth in claim 34, wherein each wadded strand of wire is an alloy wire having a diameter of approximately 0.0003 to 0.0005 inches, wherein the alloy is selected from the group consisting of beryllium and copper, silver and copper, and phosphorous and bronze.

53. A packaging construction as set forth in claim 14, wherein each wadded strand of wire extends approximately 0.001 inches above and below the insulating board.

54. A packaging construction as set forth in claim 14, wherein each wadded strand of wire is a nickel wire having a diameter of approximately 0.0003 to 0.0005 inches.

55. A packaging construction as set forth in claim 14, wherein each wadded strand of wire is an alloy wire having a diameter of approximately 0.0003 to 0.0005 inches, wherein the alloy is selected from the group consisting of beryllium and copper, silver and copper, and phosphorous and bronze.

* * * * *